United States Patent
Srinivasan et al.

(10) Patent No.: US 7,554,294 B2
(45) Date of Patent: Jun. 30, 2009

(54) BATTERY HEALTH MONITOR

(75) Inventors: Rengaswamy Srinivasan, Ellicott City, MD (US); Hassan M. Saffarian, Silver Spring, MD (US); Terry E. Phillips, Ellicott City, MD (US); Paul R. Zarriello, Catonsville, MD (US); Bliss G. Carkhuff, Laurel, MD (US); Subhas Chalasani, Troy, MI (US)

(73) Assignee: The Johns Hopkins University, Baltimore, MD (US)

( * ) Notice: Subject to any disclaimer, the term of this patent is extended or adjusted under 35 U.S.C. 154(b) by 472 days.

(21) Appl. No.: 11/045,740

(22) Filed: Jan. 28, 2005

(65) Prior Publication Data

US 2006/0170397 A1    Aug. 3, 2006

(51) Int. Cl.
*H02J 7/00*     (2006.01)
*G01N 27/416*   (2006.01)

(52) U.S. Cl. .................. 320/132; 320/128; 320/136; 320/145; 324/426

(58) Field of Classification Search .................. 320/128, 320/132, 145, 136; 324/426
See application file for complete search history.

(56) References Cited

U.S. PATENT DOCUMENTS

| | | | |
|---|---|---|---|
| 3,601,693 A | 8/1971 | Lorentzen | |
| 3,788,962 A | 1/1974 | Franck | |
| 3,873,911 A | 3/1975 | Champlin | |
| 3,939,408 A | 2/1976 | Brown | |
| 4,238,298 A | 12/1980 | Tsuru et al. | |
| 4,275,352 A | 6/1981 | Sudar et al. | |
| 4,339,719 A | 7/1982 | Rhines et al. | |
| 4,387,344 A | 6/1983 | Meyer | |
| 4,513,248 A | 4/1985 | Miller | |
| 4,682,113 A | 7/1987 | Barben | |
| 4,751,466 A | 6/1988 | Colvin et al. | |
| 4,780,664 A | 10/1988 | Ansuini et al. | |
| 4,793,175 A | 12/1988 | Fedter et al. | |
| 4,800,165 A | 1/1989 | Oka et al. | |
| 4,808,931 A | 2/1989 | Ling | |
| 4,863,572 A | 9/1989 | Jasinski | |
| 4,958,130 A | 9/1990 | Mochizuki et al. | |
| 5,179,347 A | 1/1993 | Hawkins | |
| 5,403,550 A | 4/1995 | Wietek | |

(Continued)

FOREIGN PATENT DOCUMENTS

DE      35 11706      10/1986

(Continued)

*Primary Examiner*—Adolf Berhane
*Assistant Examiner*—Yalkew Fantu
(74) *Attorney, Agent, or Firm*—Albert J. Fasulo, II

(57) ABSTRACT

A battery health monitor (BHM) that operates as a battery-mountable full-spectrum alternating current (ac) impedance meter that facilitates monitoring a state-of-charge and a state-of-health of a battery. The BHM is used for monitoring one or more electrical parameters, e.g., impedance, of a battery. The BHM includes: a current sink coupled to the first terminal and configured to sink therefrom an oscillatory current so as to cause the battery to produce at a first terminal thereof an oscillatory voltage equal to or less than a dc operating voltage of the battery that would be present at the first terminal in the absence of the oscillatory current; and a voltage sensor configured to sense the oscillatory voltage at the first terminal.

20 Claims, 8 Drawing Sheets

U.S. PATENT DOCUMENTS

| | | | |
|---|---|---|---|
| 5,448,178 | A | 9/1995 | Chen et al. |
| 5,519,330 | A | 5/1996 | Yamauchi et al. |
| 5,674,375 | A | 10/1997 | Thompson |
| 5,712,559 | A | 1/1998 | Moore et al. |
| 5,792,337 | A | 8/1998 | Padovani et al. |
| 5,854,557 | A | 12/1998 | Tiefnig |
| 5,855,721 | A | 1/1999 | Monteiro et al. |
| 5,889,387 | A * | 3/1999 | Massie ............ 320/145 |
| 5,895,843 | A | 4/1999 | Taylor et al. |
| 6,002,238 | A | 12/1999 | Champlin |
| 6,012,337 | A | 1/2000 | Hodge |
| 6,057,693 | A | 5/2000 | Murphy et al. |
| 6,114,838 | A * | 9/2000 | Brink et al. ............ 320/136 |
| 6,132,593 | A | 10/2000 | Tan |
| 6,160,483 | A | 12/2000 | Radwan |
| 6,172,483 | B1 | 1/2001 | Champlin |
| 6,172,505 | B1 | 1/2001 | Bertness |
| 6,223,129 | B1 | 4/2001 | Chan et al. |
| 6,262,563 | B1 | 7/2001 | Champlin |
| 6,313,751 | B1 | 11/2001 | Whitmire et al. |
| 6,320,395 | B1 | 11/2001 | Bosch et al. |
| 6,323,650 | B1 | 11/2001 | Bertness et al. |
| 6,466,026 | B1 | 10/2002 | Champlin |
| 6,469,512 | B2 | 10/2002 | Singh et al. |
| 6,507,171 | B2 * | 1/2003 | Ruha et al. .................. 320/128 |
| 6,778,913 | B2 | 8/2004 | Tinnemeyer |
| 6,796,187 | B2 | 9/2004 | Srinivasan et al. |
| 7,019,542 | B2 | 3/2006 | Tinnemeyer |
| 2001/0054899 | A1 | 12/2001 | Bertness |
| 2002/0057097 | A1 | 5/2002 | Kelly et al. |
| 2002/0171428 | A1 | 11/2002 | Bertness |
| 2003/0011387 | A1 | 1/2003 | Trejo et al. |
| 2003/0071627 | A1 | 4/2003 | Champlin |
| 2003/0124417 | A1 | 7/2003 | Bertness et al. |

FOREIGN PATENT DOCUMENTS

| | | |
|---|---|---|
| DE | 35 17772 | 11/1986 |
| WO | WO 88/09498 | 12/1988 |
| WO | WO 99/58990 | 11/1999 |
| WO | WO 02/46701 | 6/2002 |
| WO | WO 03/006958 | 1/2003 |
| WO | WO 2004/010104 | 1/2004 |

* cited by examiner

BATTERY HEALTH MONITOR

CROSS REFERENCE TO RELATED APPLICATIONS

This application is related to U.S. Provisional Application No. 60/511,555, entitled "Battery Health Monitor," filed on Oct. 15, 2003, which is incorporated herein by reference in its entirety.

BACKGROUND OF THE INVENTION

1. Field of the Invention

The present invention relates generally to a system for monitoring the state-of-charge and state-of-health of batteries.

2. Discussion of the Related Art

The requirement for monitoring the health of batteries has been in existence, perhaps, for as long as the batteries themselves. Over the past several decades, numerous instruments and devices that purport to monitor the health of batteries have been used. Some of these devices are based on the measurement of the battery electrolyte specific gravity and others rely on the measurement of the battery voltage with and without a load. The relatively more complex instruments record the current and voltage, and/or coulombs of electric charges during the charging and discharging periods. Difficulties and deficiencies associated with these instruments include large mass, volume and power consumption, high complexity and cost, and measurement inaccuracies. Thus there is a need for an apparatus for monitoring the health of battery that is relatively small and light, low in power consumption, complexity and cost, and that provides accurate information about the state-of-charge (SOC) and state-of-health (SOH) of batteries. Note that the SOC indicates the useful operating time available in a battery following charging and partial use. SOH indicates the available life of a battery following its use after manufacturing.

SUMMARY OF THE INVENTION

Embodiments of the present invention overcome the aforementioned prior art disadvantageous to meet one or more of the aforementioned needs. An embodiment of the present invention is a battery health monitor (BHM) for monitoring one or more electrical parameters of a battery, the battery including first and second terminals of opposite polarity and configured to produce a direct current (dc) operating voltage at the first terminal. The BHM includes: a current sink coupled to the first terminal and configured to sink therefrom an oscillatory current so as to cause the battery to produce at the first terminal an oscillatory voltage equal to or less than the dc operating voltage that would be present at the first terminal in the absence of the oscillatory current; and a voltage sensor configured to sense the oscillatory voltage at the first terminal. The BHM further comprises control circuitry configured to generate an oscillatory current control signal, wherein the current sink is configured to sink the oscillatory current from the first terminal responsive to the oscillatory current control signal. In another embodiment of the BHM, the BHM determines an impedance of the battery based on an apriori knowledge of the sinking current and the sensed oscillatory voltage. In a system embodiment, the BHM includes a transmitter configured to transmit the sensed voltage indicative of the oscillatory voltage to a remote station and the remote station determines the one or more electrical parameters of the battery based on the transmitted information and an apriori knowledge of the sinking current.

Other apparatus, system and method embodiments, and features of the present invention will become apparent based on the ensuing description.

BRIEF DESCRIPTION OF THE DRAWINGS

The above and other features and advantages will become more readily apparent from the detailed description of the invention accompanied by the following drawings, in which.

DETAILED DESCRIPTION OF THE EMBODIMENTS

Figure 1A:
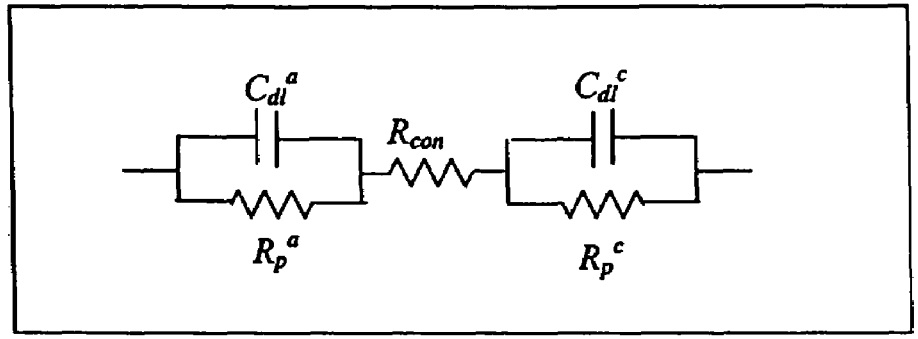
FIG. 1A is a schematic diagram of an electrical equivalent circuit of a battery.

Electrochemical Impedance Spectroscopy for Battery Health Monitoring

A battery is an electrochemical cell and as such can be described and analyzed using the very mature science of electrochemistry developed over the last 100 years. An approach that accurately describes the state of health of a battery, without any need for knowledge of its historical charge/discharge record, is based on electrochemical impedance spectroscopy (EIS), also known as alternating current (ac) impedance spectroscopy (or impedance spectroscopy). EIS is a well-known electrochemical technique and has been in use since the 1940s to measure the internal impedance of electrochemical cells. It uses a small-amplitude (<1 millivolt) ac voltage source to perturb the electrochemical cell. In response, the cell generates an ac current at the same frequency, whose magnitude and phase can be utilized to ascertain the battery's impedance at that particular frequency. The impedance of the cell is determined by using complex-algebraic principles, defined as the vector ratio of Volts (V) and Current (I) (or current/unit area, also called current density, i). By repeating the perturbation and the response measurement at several frequencies, one determines the impedance over a range or spectrum of frequencies, and this information is used to determine the battery's state of health. Analogously, a variant of the above technique uses a small-amplitude (1-10- milli ampere) ac current source to perturb the electrochemical cell. In response, the cell generates an ac voltage at the same frequency, which is used to measure the ac impedance of the cell.

Frequency Range and Signal Levels

EIS measurements have been made on lead-acid and nickel-cadmium batteries using large bench-scale electronic equipments. Theories relating the internal properties of a battery to its ac impedance properties have been described in the published literature over the past three decades. Over the same period, a large body of data relating the EIS data to the SOC and SOH of a battery have been published. It has been demonstrated that there is a strong correlation between ac impedance and the battery's SOH and SOC. However, the data can be interpreted with best accuracy if the measurements cover several, e.g., three or four decades in frequency, such as 0.1 to 10000 Hz, with several, e.g., three to five frequencies per decade, for example, 0.1, 0.2, 0.3, 0.5, 0.7, 1.0, 2.0, 3.0, 5.0, 7.0, 10.0 . . . Hz and so on up to 10,000 Hz. Conventional technology permits relatively accurate measurements of the amplitude and phase only through the use of large, expensive bench-top instruments. Smaller instruments, such as conventional hand-held devices purporting to measure ac impedance typically utilize relatively large amplitude (>10 mV) battery perturbation signals at a limited number of non-concurrent frequencies (usually one or two). The use of large amplitude signals causes the system (battery) to deviate from its normal equilibrium behavior, thus potentially invalidating the results. The theory of ac impedance measurement is applicable only in the limit of a zero voltage perturbing signal amplitude. For real world purposes, a perturbing signal on the order of 1 mV, which is around 1/1500 of the cell voltage of a 1.5-V battery, is considered to be a reasonable compromise between practical signal levels and the need to minimize the perturbing voltage in order to obtain accurate results. Perturbation voltages>10-mV may cause serious inaccuracy in impedance values. The use of only one or two frequencies (instead of tens spanning four orders-of-magnitude of frequencies) also makes data interpretation difficult, often resulting in errors in estimating SOH and SOC.

The deficiencies with instruments that use only a small number, such as one or two, of frequencies in their measurement is further explained as follows. As noted above, a battery is an electrochemical device and as such contains two electrodes having opposite polarities, namely, the positive pole or electrode (cathode) and the negative pole or electrode (anode). Inside the battery, there is flow of electric current, in association with two chemical reactions, one on each electrode. There is also an electrolyte, which carries electricity through the flow of ions, which are positively or negatively charged atoms and/or molecules. There is also a physical interface between the electrolyte and each electrode.

When a battery is discharged, the battery voltage drops in proportion to the discharge (current) rate, as well as the discharge time. Additionally, the temperature of the battery rises and the voltage drop dependence on the discharge rate and time is also dependent on the temperature. All of these phenomena occur, because as the current is flowing through the battery, and it experiences resistance at the interface between the electrolyte and the electrodes, and also in the electrolyte itself. The resistance due to the electrolyte is termed $R_{electrolyte}$ (also called $R_{conc}$) and the resistance at the interfaces is known as $R_p$. Furthermore, there is always a separation of positive and negative charges at the interface between each electrode and the electrolyte. The charge separation makes the interface behave like a capacitor, which is denoted as the interfacial capacitance ($C_{dl}$). The physical characteristics of a battery are often represented in terms of an electrical equivalent circuit incorporating the above defined resistances and capacitance, which is shown in FIG. 1A.

FIG. 1A is a schematic diagram of the electrical equivalent circuit of a battery, as it appears between the anode (negative pole) and the cathode (positive pole) of a single-cell battery. If the battery has more than one cell, each cell can be represented by a similar set of equivalent circuit. Furthermore, equivalent circuits of all the cells can be merged to the same form as the equivalent circuit of a single cell. $R_{electrolyte}$ is the electrolyte resistance, $C_{dl}$ is the double layer capacitance; and $R_p$ is the polarization resistance; in FIG. 1A, the superscripts "a" and "c" refer to anode and cathode, respectively.

The values of $R_{electrolyte}$, $R_p$, and $C_{dl}$ provide accurate information on the SOH and SOC of the battery. However, $R_{electrolyte}$, $R_p$, and $C_{dl}$ can be estimated accurately, only if the EIS measurements are performed with low amplitude perturbation signals, and using multiple (15-20) frequencies, over many (e.g., three or four) decades of the frequency domain.

Estimation of Polarization and Electrolyte Resistances

Figure 1B:
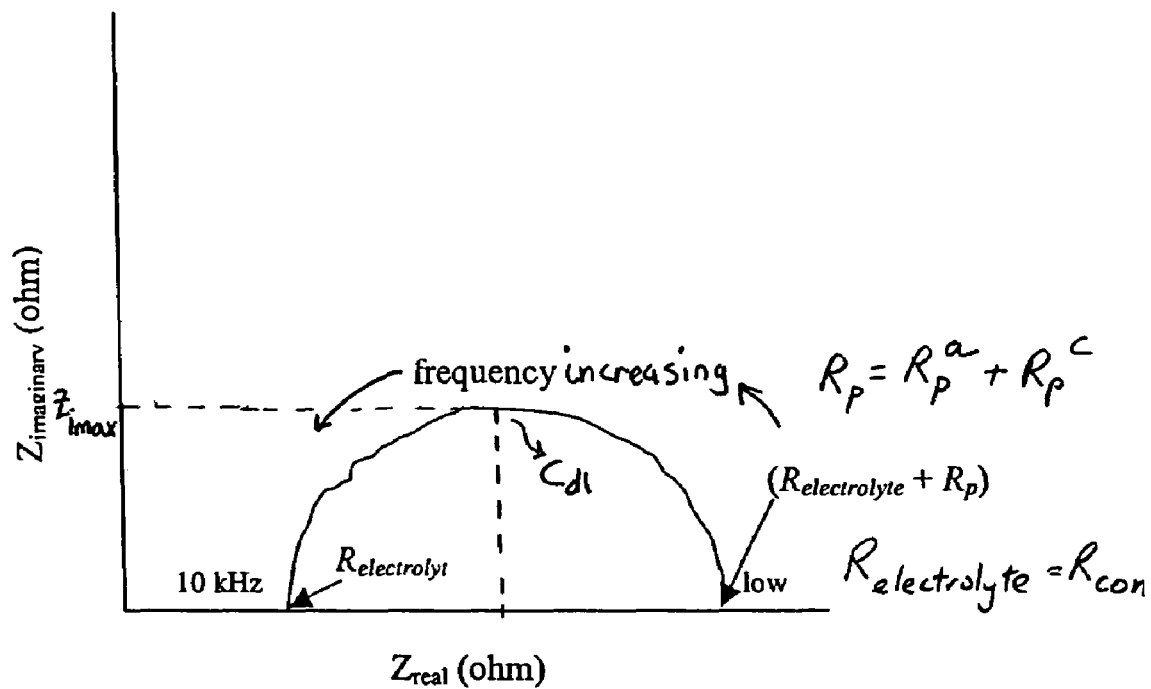
FIG. 1B shows a complex plane plot of an impedance of the electrical circuit in FIG. 1A.

FIG. 1B shows a complex plane plot of the impedance of the electrical circuit in FIG. 1A. The impedance, which is a vector ratio between V and I, varies as function of the frequency of the perturbation signal applied to the terminals of the battery. The value of real component ($Z_{real}$) of the impedance at the extreme low frequency provides the sum $R_{electrolyte}+R_p$. At the limit of the high frequency, $Z_{real}$ provides $R_{electrolyte}$. The maximum value $x$ of the imaginary component ($Z_{imaginary}$) is related to $C_{dl}$ through the frequency $f_{max}$. In an actual cell or battery, one has no a priori knowledge of the exact low- or high-frequency limits, $Z_{imax}$, and $f_{max}$. It can (and usually does) vary with SOH and the SOC of the battery. That is, at various states-of-charge, or at different point of its age (SOH), a battery has different $C_{dl}$, $R_{electrolyte}$ and $R_p$ values. Therefore, it is hard to predict extreme low- and high-frequency limits at which the $Z_{real}$ value would correspond to $R_{electrolyte}$, $R_p$ and so on. In order to obtain $R_{electrolyte}$, and $R_p$ and $C_{dl}$, one has to make the impedance measurements at multiple (usually, 15 to 20) frequencies. Herein lies the essential problem with most small, hand-held devices, which use one or two frequencies to obtain $R_{electrolyte}$, $R_p$, and $C_{dl}$. The operators of those instruments have no way of knowing a priori the frequencies to select. Consequently, the derived measures of SOH and SOC are rather questionable.

Limitations of Existing Instruments Used in Measuring Battery Impedance

Added to the frequency-related problem described above, is the complexity associated with measuring phase values accurately. Spectrum analyzers or lock-in-amplifiers used for such a purpose are usually large. The problem is further complicated by the battery voltage (dc volt), which in some cases can be as small as 1 Volt, or as large as 12 Volts or 24 Volts (car batteries), or even 48 Volts (batteries in hybrid cars). Most instruments are not designed to handle such high dc voltages. Although ac-coupling may appear to alleviate this dc voltage problem; ac coupling, due to its intrinsic capacitive properties of the coupling interfaces, may introduce additional problems in interpreting the impedance data. Furthermore, a discharging battery generates currents in the range of a few milliamperes to several tens of amperes; and such magnitudes of currents are also associated with the battery under charge. Measurement of impedance, while the battery is being charged or discharged usually needs fairly complex instrumentation.

Until now, if one needed to measure impedance of batteries at multiple frequencies, especially when the battery is under charge or discharge, one needed complex instrumentation (several different bench top equipment such as signal generator, spectrum analyzer and so on in concert); together they are generally too large to be hand held. On the contrary, the device that we describe in this invention is smaller than most hand-held devices, uses at least three, e.g., 18, frequencies, and can be used on any battery, independent of the battery voltage or charge/discharge current.

Battery Health Monitoring System

Figure 2:
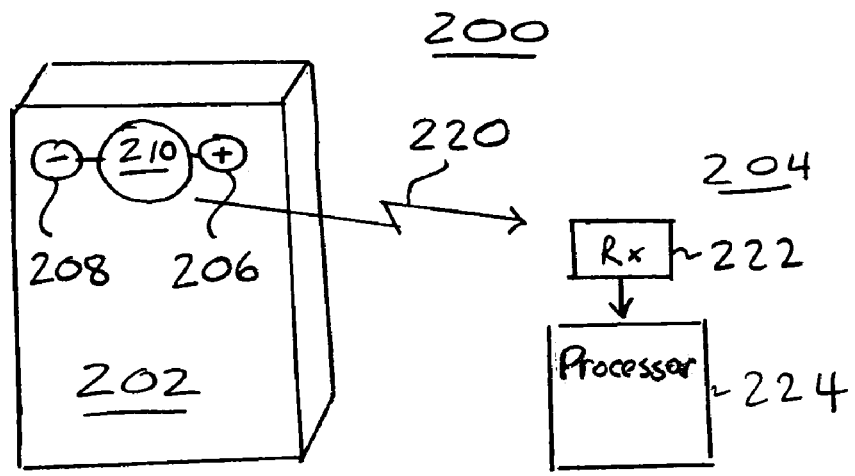
FIG. 2 is a block diagram of an example environment in which embodiments of the present invention can operate to monitor a health of a battery.

FIG. 2 is a block diagram of an environment 200 in which embodiments of the present invention can operate to monitor a health of a battery 202. Battery 202 can be any battery having terminals of opposite polarities such as a positive terminal 206 and a negative or ground terminal 208. Battery 202 is rated by its manufacturer to produce at positive terminal 206 a manufacturer nominal rated direct current (dc) voltage $V_R$. However, during operation, battery 202 produces at positive terminal 206 a nominal dc operating voltage $V_O$ that may be below rated voltage $V_R$ and that changes over time depending on a state of charge and health of the battery. Battery 202 produces dc operating voltage $V_O$ while the battery is (i) discharging through a load, that is, sourcing a current through the load, or (ii) being charged, that is, sinking a current from a charging circuit.

An exemplary battery health monitoring system of the present invention includes a battery health monitor (BHM) 210 connected between battery terminals 206 and 208, and a remote monitoring station 204 separated from BHM 210, which operate together to monitor the health of battery 202. As will be described in detail below, BHM 210 stimulates battery 202 and senses a thus stimulated ac voltage at battery terminal 206. BHM 210 senses the stimulated ac voltage and transmits a signal 220 indicative of the stimulated ac voltage to remote monitoring station 204. A receiver 222 of the remote station 204 receives signal 220 and passes information from the received signal to a data processor/data storage device. Processor 224 determines one or more electrical parameters of battery 202 based on the received signal information and apriori information stored at the Processor 224 in a manner described in detail below. For example, computer 224 may determine any of the following electrical battery parameters: a battery state-of-charge, state-of-health, capacitance parameter or impedance parameter such as an internal impedance, electrolyte resistance, or battery polarization.

Battery Health Monitor 210

Figure 3:
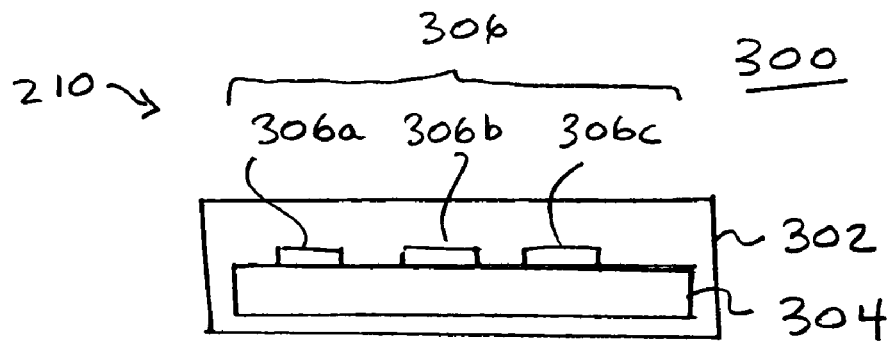
FIG. 3 is a cross-sectional view of an example packaging arrangement of a battery health monitor (BHM) of FIG. 2.

FIG. 3 is a cross-section view of an example packaging arrangement 300 of BHM 210. Package 300 includes a housing 302 and a printed circuit board (PCB) 304 at least partially enclosed within or encapsulated by housing 302. Typically, housing 302 is mounted to battery 202, and may be manufactured as a part of a shell or casing of the battery. BHM circuits or electronics 306, which may include one or more integrated circuit (IC) chips 306a-306c, are mounted to PCB 304. In general, housing 302 may be formed from materials that include, but are not limited to, ceramic materials such as alumina or macor and the like, plastics or polymers. Alternatively, housing 302 may be made of a metal composition such as aluminum or a combination of non-metallic and metallic materials. Dimensions and configurations of housing 302 and circuit board 304 can vary and can be determined on a case-by-case basis. For example, when housing 302 is disc-like in shape, the housing can be approximately one inch in diameter. It is within the contemplation of the present invention to further reduce the size of housing 302 in future embodiments to a package volume less than 2.5 cm$^3$ (0.15 in3).

Figure 4:
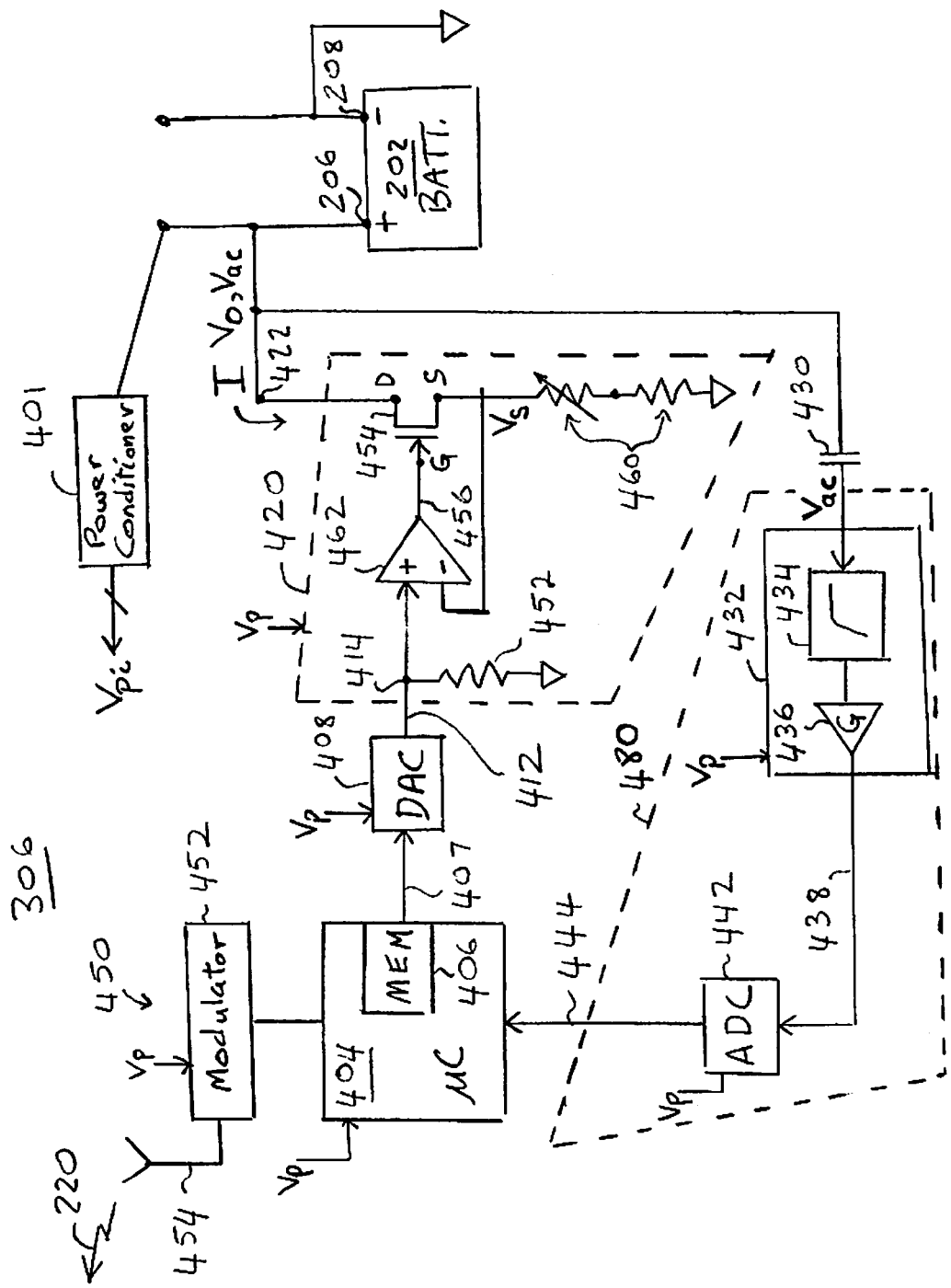
FIG. 4 is an example circuit diagram of electronics of the BHM of FIG. 2.

FIG. 4 is an example circuit diagram of electronics 306 of BHM 210. BHM electronics 306 (also referred to as BHM circuit 306) include a power conditioner 401 coupled to positive terminal 206 and configured to derive one or more dc voltages $V_{P1} \ldots V_{PN}$ suitable for operating/powering the various circuits of BHM circuit 306. Power conditioner 401 may include passive, active or both types of circuit elements. Power conditioner 401 applies voltages $V_{Pi}$ to the appropriate circuits of BHM circuit 306. Each of the circuits of BHM circuit 306 is also connected to negative terminal 208. In this manner, BHM circuit 306 derives from battery 202 its full operating power, which typically may be approximately equal to or less than 100 milliWatts.

BHM circuit 306 also includes a controller 404, coupled with a memory 406, for controlling circuit 306. Stored in memory 406 is a unique digital identifier (ID) that identifies battery monitor 210. Also stored in memory 406 is a digitized waveform representative of a current control signal and a battery sinking current to be generated by circuit 306. Controller 404 accesses the digitized waveform and provides the accessed waveform as digitized waveform 407 to an input of a digital-to-analog (DAC) converter 408. DAC 408 converts digitized waveform 407 to a current control signal 412 and provides same to an input terminal 414 of a Voltage-Controlled Current Source (VCCS) 420.

VCCS 420 includes an output terminal 422 coupled to positive battery terminal 206. Responsive to current control signal 412, output terminal 422 of VCCS 420 sinks an oscillatory current I from the positive battery terminal in such a manner as to cause battery 202 to produce at the positive battery terminal an oscillatory voltage $V_{ac}$ that is equal to or less than the nominal dc operating of voltage $V_O$ of the battery, that is, that would be present at the positive terminal in the absence of sinking current I. Sinking current I represents a battery perturbation current that stimulates battery 202 to produce perturbation or stimulated voltage $V_{ac}$. An advantage of using sinking current I to perturb battery 202 is that no additional power supply is needed in BHM 210. In contrast, use of a sourcing current (for example, supplying current to battery terminal 206) instead of the sinking current would disadvantageously require an additional power supply. At terminal 206, ac voltage $V_{ac}$ includes a dc voltage offset from ground potential as a result of the battery dc operating voltage $V_O$. Controller 404, memory 406 and DAC 408 collectively represent control circuitry configured to generate current control signal 412. The control circuitry may have different configurations, which may produce current control signal 412 as either a current or a voltage, as would be apparent to one having ordinary skill in the relevant art(s).

In an embodiment, the controller 404 in BHM 210 operates to cause sinking current I to be a composite current including several (e.g., three to five) concurrent, summed-together sinusoidal frequencies in each of three or four consecutive frequency decades (e.g., spanning 0.1 to 10,000 Hz using frequencies: 0.1, 0.2, 0.4, 1, 2, 4, 10, 20, 40, 100, 200, 400, . . . up to 10,000 Hz). It is also preferable that all of the frequencies have approximately equal amplitudes. In an embodiment, the frequencies include a fundamental frequency and multiple even frequency harmonics thereof, although odd frequency harmonics of the fundamental frequency can also be used. Preferably, the at least three sinusoidal frequencies are phase shifted with respect to each other so as to maintain a substantially constant magnitude of sinking current I. Such phase shifting substantially avoids (i) amplitude nulls caused by destructive interference between the concurrent frequencies, and (ii) amplitude peaks caused by constructive interference between the concurrent frequencies. The digitized waveform stored in memory 406, signals 407 and 412, and stimulated ac voltage $V_{ac}$ all have frequency spectrums similar to sinking current I. The digitized waveform stored in memory 406 represents an apriori knowledge of the amplitude, phase and frequency characteristics of sinking current I.

In an arrangement, BHM circuit 306 may operate to sink current I from battery 202 while the battery is in an open circuit condition, as depicted in FIG. 4, that is, while no load is connected between battery terminals 206, 208. In an alternative arrangement, BHM circuit 306 may operate to sink current I from battery 202 while the battery is discharging through a resistive load connected between battery terminals 206, 208, that is, while the battery is operating normally. In yet another arrangement, BHM circuit 306 may operate to sink current I from battery 202 while the battery is being charged by a charging circuit connected to battery terminals 206, 208. In the battery discharging and charging arrangements, it is preferable that a magnitude of sinking current I is approximately 1/1000 of a magnitude of the battery discharging/charging current so as to not disturb the normal battery charging/discharging operation and thus ensure accurate monitoring results. In each of the arrangements, BHM circuit 306 sinks current without raising the voltage at terminal 206 above its nominal dc operating voltage $V_O$.

A capacitor 430 coupled to positive terminal 206 ac couples voltage $V_{ac}$ to an input of an optional signal conditioner 432. That is, capacitor 430 blocks the dc operating voltage $V_O$ of battery 202, thus passing only ac voltage $V_{ac}$ to signal conditioner 432. Signal conditioner 432 includes an optional filter 434, such as a high pass filter, followed by an optional gain or amplitude scaling stage 436. Filter 434 has a frequency pass band coinciding with the concurrent frequencies present in sinking current I and, correspondingly, in ac voltage $V_{ac}$. Together, filter 434 and gain stage 436 filter and amplitude scale voltage $V_{ac}$ to produce a filtered, scaled (i.e., conditioned) voltage 438 representative of voltage $V_{ac}$. An analog-to-digital converter (ADC) 442 converts conditioned voltage 438 to a digitized voltage 444 representative of voltage $V_{ac}$, and provides the digitized voltage to controller 404. ADC 442 and optional signal conditioner 432 collectively represent a voltage sensor 480 that senses voltage $V_{ac}$ and produces sensed voltage 444 representative of voltage $V_{ac}$.

Controller 404 passes digitized voltage 444 and the unique ID stored in memory 406 to a wireless transmitter 450. Wireless transmitter 450 includes a modulator 452 and an antenna 454 configured to convert digitized voltage 444 to a transmissible signal and to transmit said transmissible signal (along with the unique battery ID) as wireless signal 220, which is indicative of voltage $V_{ac}$. In another embodiment, a wired transmitter is used to transmit the transmissible signal over a wired connection.

In an embodiment, BHM circuit 306 applies (i.e., sinks) composite current I periodically with a predetermined duty cycle in order to conserve power. When operating in this manner, BHM circuit 306 sinks composite current I from battery 202 during an ON cycle of the BHM circuit for a period of time equal to multiple cycles of a lowest frequency among the at least three concurrent sinusoidal frequencies of composite current I. For example, if the lowest or fundamental frequency of current I is 0.1 Hz, then composite current I will be applied for 50 seconds (that is, repeated five times). During the ON cycle, ADC 442 digitize conditioned voltage 438 and transmitter 450 transmits signal 220. After the ON cycle, BHM circuit 306 turns itself OFF for a period of time before cycling back to ON.

VCCS 420 is now described in detail. VCCS 420 includes an input resistor 452 coupled between input terminal 414 and negative battery terminal 208 for converting current control signal 412 to a voltage at input terminal 414. VCCS 420 also includes a Field Effect Transistor (FET) 454 having a drain connected to positive battery terminal 206 and a source connected to one end of a variable resistor 460. The other end of the variable resistor 460 is connected to negative battery terminal 208, whereby resistor 460 and the drain-source current path of FET 454 are connected in series with each other and between positive and negative battery terminals 206, 208. FET 454 may be an NMOS FET, an NPN IGBJT or a standard NPN BJT.

VCCS 420 also includes an amplifier 462, which, in an embodiment, is a differential amplifier such as an operational amplifier. Amplifier 462, having a positive input connected to input terminal 414 and an output connected to a gate of FET 454, provides a control terminal voltage 456 to the gate of FET 454. The source of FET 454 is connected to a negative input of amplifier 462. As control terminal voltage 456 increases, a sinking current flows from terminal 206 through the drain-source current path of FET 454 and resistor 460 to terminal 208. A sense voltage Vs developed across resistor 460 (at the source of FET 454) is fed back to the inverting input of amplifier 462. In response, amplifier 462 adjusts control terminal voltage 456 so as to maintain a level of sinking current I proportional to the voltage at input terminal 414 divided by the value of resistor 460. Thus sinking current I has the following relationship to the voltage at input terminal 414:

Sinking Current=Voltage at input terminal 414/value of resistor 460

The value of resistor 460 sets the maximum magnitude of sinking current I for a given maximum voltage at input terminal 414.

BHM Waveforms

Figure 5:
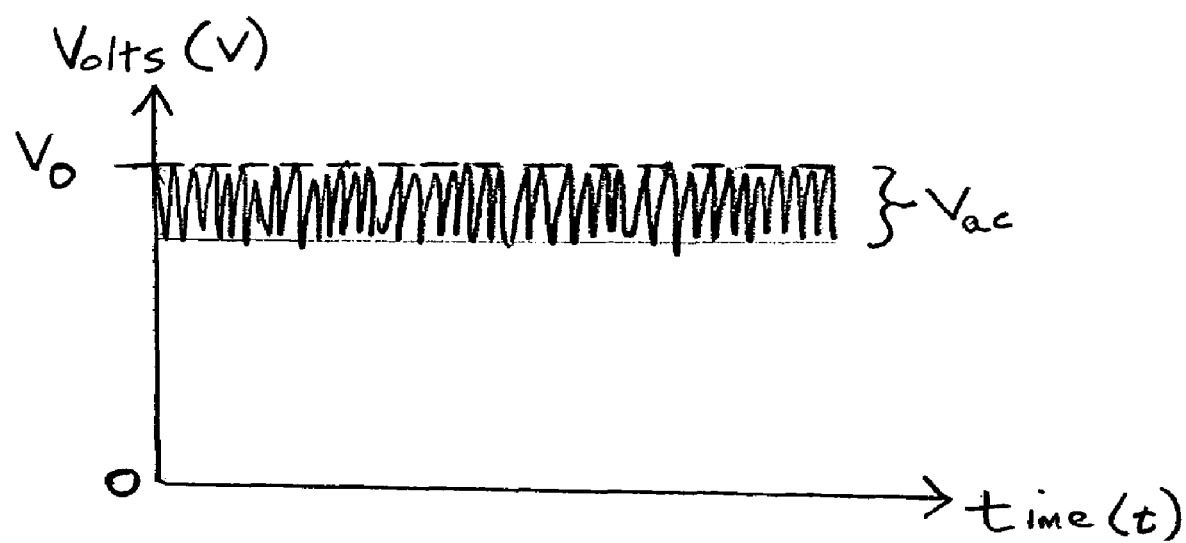
FIG. 5 is an example plot of an oscillatory battery terminal voltage $V_{ac}$ stimulated by the BHM.

FIG. 5 is an example plot of the battery terminal ac voltage $V_{ac}$ versus time while BHM circuit 306 sinks current I from the battery 202. Voltage $V_{ac}$ is an oscillatory composite voltage responsive to composite current I, that is, including multiple concurrent sinusoidal frequencies. The level of voltage $V_{ac}$ varies at or below the nominal dc operating voltage $V_O$ of battery 202. In addition, voltage $V_{ac}$ is unipolar because it is above the voltage of negative or ground terminal 208.

Figure 6:
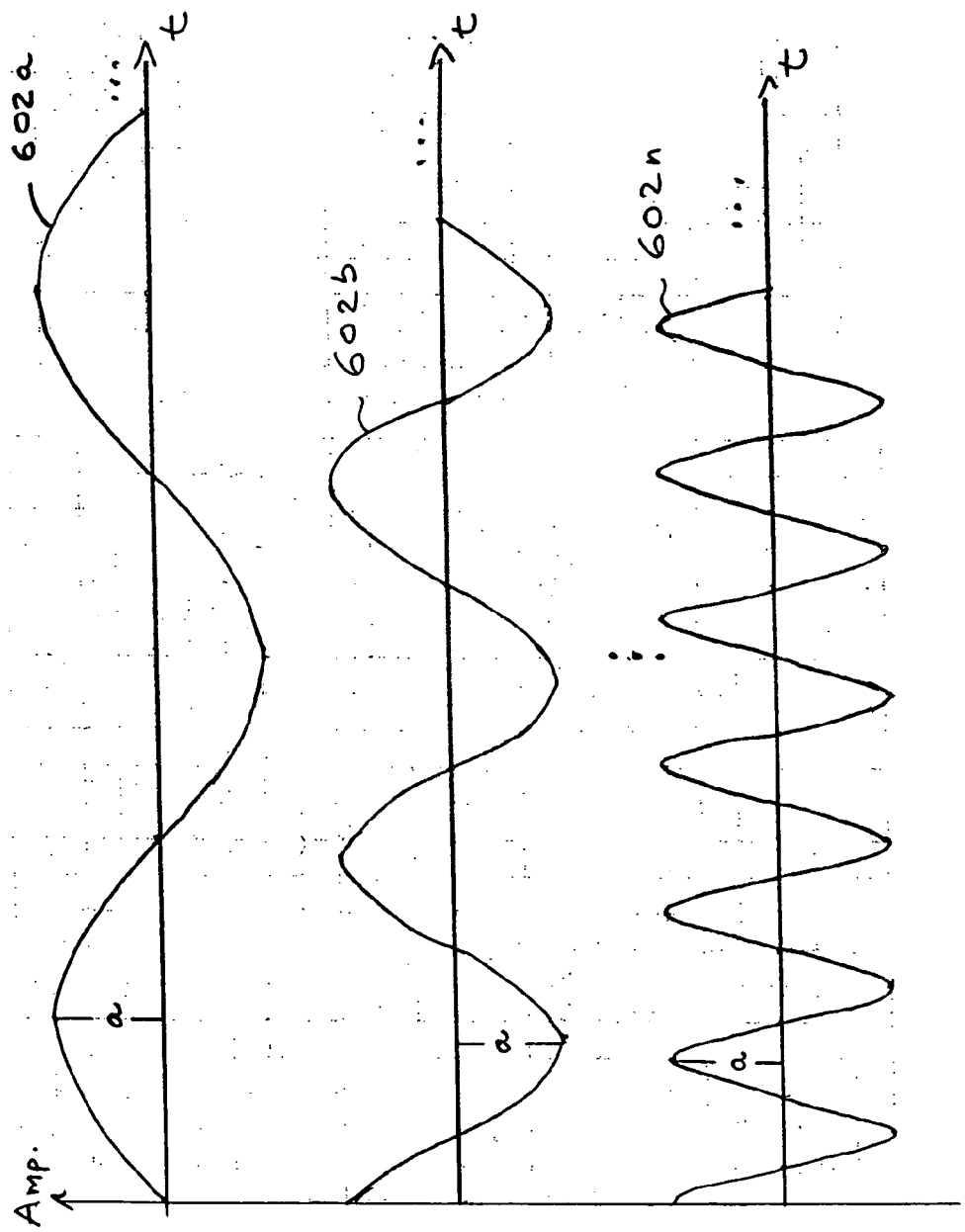
FIG. 6 is an illustration of multiple concurrent sinusoidal frequencies representing frequency components that are summed together to produce battery current control signals and a battery sinking current related to the operation of the BHM.

As mentioned above, sinking current I is a composite current including multiple concurrent frequencies. FIG. 6 is an illustration of multiple concurrent sinusoidal frequencies 602a-602n representing frequency components of sinking current I. Frequencies 602 have substantially equal amplitudes a, and phases offset with respect to each other. The concurrent frequencies 602 sum together to form a composite waveform, that is, the current waveform i.

Figure 7:
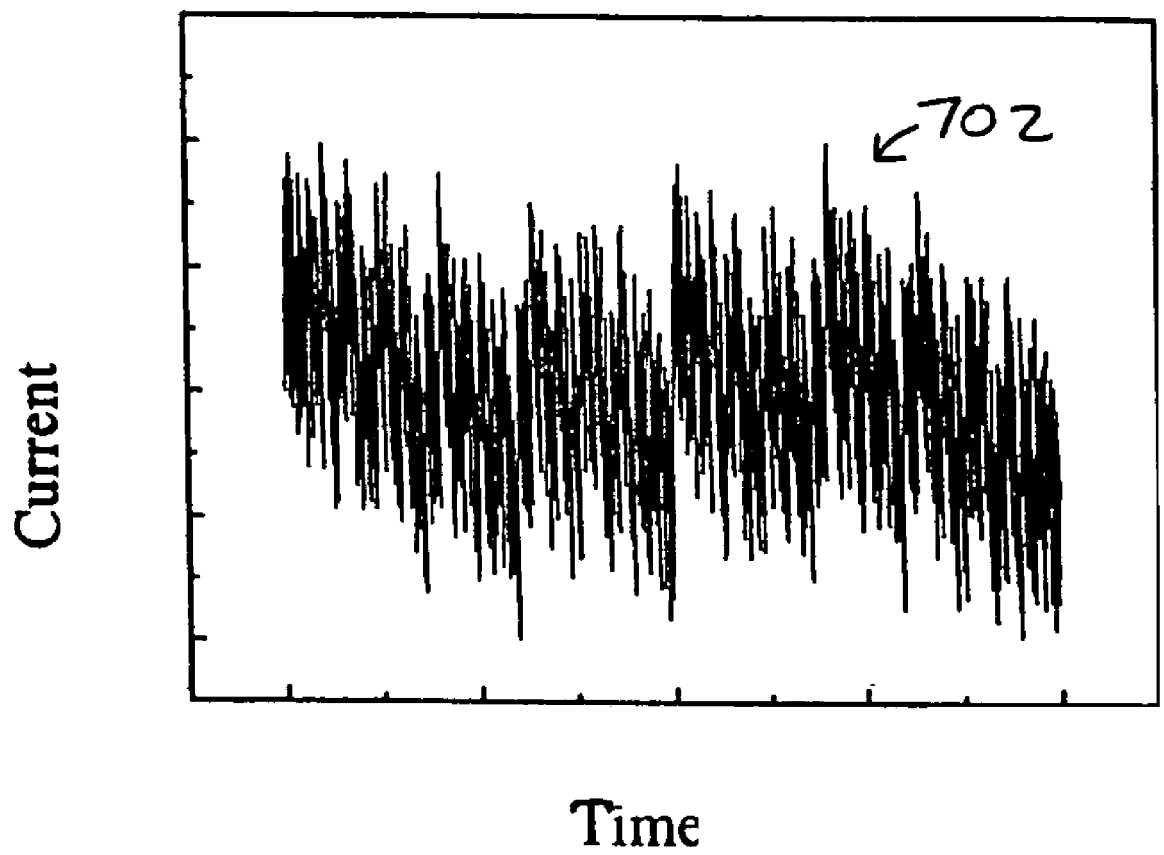
FIG. 7 is an illustration of a composite waveform representing the summation of the frequency components of FIG. 6.

FIG. 7 is an illustration of a composite waveform 702 representing sinking current I, formed by summing frequencies 602. Waveform 702 also represents the digitized waveform stored in memory 406, signal 407, current control signal 412 and gate control voltage 456.

Remote Station Computer

Figure 8:
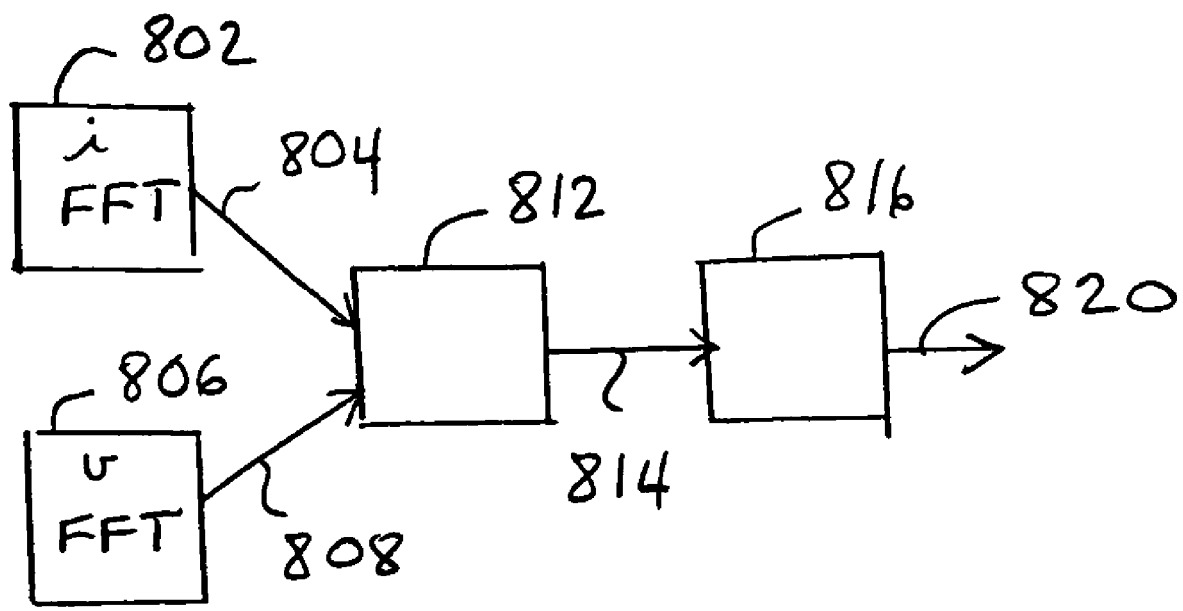
FIG. 8 is a block diagram of a processing architecture for a computer of FIG. 2 used for determining one or more electrical parameters of the battery of FIG. 2.

FIG. 8 is a block diagram of a processing architecture for processor 224 used for determining one or more monitored electrical parameters of battery 202. Processor 224 may be any know computer or controller system. It is assumed that the processor 224 includes a memory for storing digitized waveform 407, that is, the processor 224 has an apriori knowledge of the waveform of current I used to stimulate battery 202. In computer 224, a module 802 derives a frequency spectrum 804 of stimulus current I based on the waveform stored locally at the computer. A module 806 derives a frequency spectrum 808 of sensed voltage $V_{ac}$, as conveyed in wireless signal 220 representative of the sensed voltage. Modules 802 and 806 can use fast Fourier transform techniques to derive their respective frequency spectrums. A module 812 derives an impedance 814 of battery 202 as a function of current and voltage frequency spectrums 804 and 808. For example, module 812 may derive Nyquist and/or Bode plots from signals 804 and 808. A module 816 determines one or more electrical parameters 820 based on battery impedance 814. Such parameters include a capacitance or an impedance parameter such as internal impedance, electrolyte resistance, or battery polarization resistance.

Alternative Embodiment for the BHM

In another embodiment of BHM 210, BHM controller 404 includes all of processing modules 802-816. That is, the logic corresponding to modules 802-816 is integrated into controller 404, for example, as computer software. In this embodiment, controller 404 receives digitized signal 444 indicative of voltage $V_{ac}$ and then uses this logic to determine the above-mentioned battery parameters. In this embodiment, BHM 210 can then transmit the determined battery parameters to a remote station, or a display.

Method Flow Chart

Figure 9:
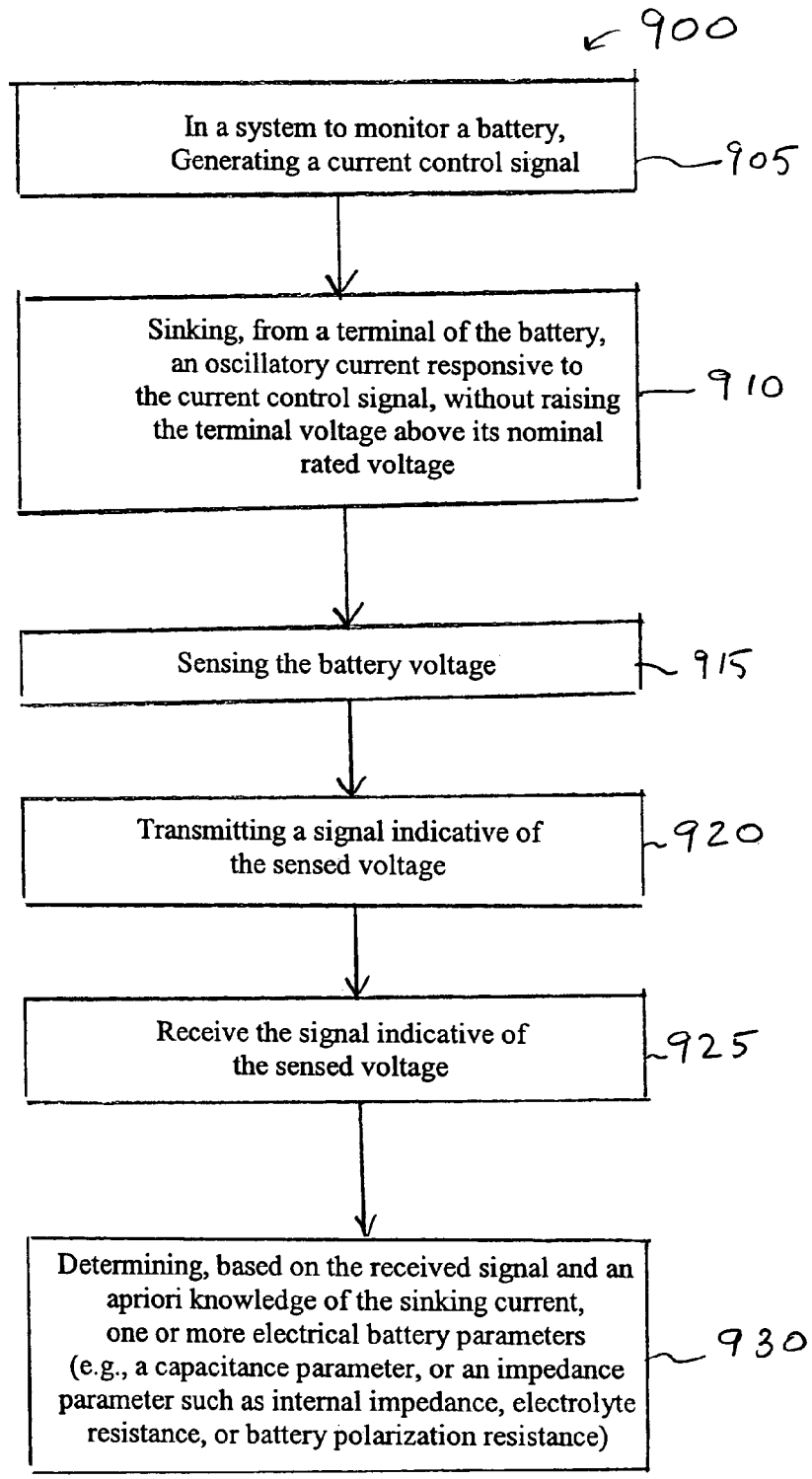
FIG. 9 is a flow chart of an example method of monitoring a battery using the system of FIG. 2.

FIG. 9 is a flow chart of an example overview method 900 of monitoring battery 202 in system 200. A first step 905 includes generating current control signal 412.

A next step 910 includes sinking, from battery 202 oscillatory current I responsive to current control signal 412, without raising the positive battery terminal voltage above its nominal dc operating voltage $V_O$.

A next step 915 includes sensing battery voltage $V_{ac}$ produced responsive to sinking current I.

A next step 920 includes transmitting signal 220 indicative of the sensed voltage (and thus, voltage $V_{ac}$).

A next step 925 includes receiving at remote station 204 signal 220 indicative of the sensed voltage (and thus, voltage $V_{ac}$).

A next step 930 includes determining, based on the received signal indicative of the sensed voltage (and thus, voltage $V_{ac}$) apriori knowledge of the sinking current I, one of more electrical battery parameters.

It is to be understood that method 900 represents multiple independent inventions. For example, steps 905 through 920 can be practiced independent of steps 925 and 930. Also, step 920 is optional. In the alternative embodiment of BHM 210 described above, steps 905 through 915 are executed in BHM 210. Step 930 is also executed in BHM, wherein controller 404 determines the one or more electrical parameters based on the apriori knowledge of the sinking current (for example, available as the waveform stored in memory 406) and using digitized sensed voltage 444.

BHM Features

BHM assists in monitoring the health of a battery, and specifically, can assist in measuring the following parameters of the battery:

1. The state-of-charge (SOC);
2. The state-of-health (SOH);
3. The internal impedance of the battery;
4. The electrolyte resistance;
5. The polarization resistance (the resistance associated with the reactions at the interface between the electrolyte and the two terminals (positive and negative);
6. The voltage between the two battery terminals;
7. All the above measurements are measured either online (when the battery is being charged or discharged) or under Open Circuit Voltage (OCV) conditions;
8. BHM has a built in transmitter that will transmit the data to a remote monitoring station in a wireless operation; and
9. Each BHM has an electronic ID, making it easy to associate the transmitted data to exact battery being monitored by the BHM.

All of the above features are provided using the BHM, which is a small-sized, and obtaining the necessary power to operate from the battery itself.

CONCLUSION

It will be understood that various modifications may be made to the embodiments disclosed herein. Therefore, the above description should not be construed as limiting the scope of the invention, but merely as exemplifications of the preferred embodiments. Those skilled in the art will envision other modifications within the scope and spirit of the claims appended hereto.

What is claimed is:

1. A battery health monitor for monitoring one or more electrical parameters of a battery, the battery including first and second terminals of opposite polarity and configured to produce a direct current (dc) operating voltage at the first terminal, comprising:

control circuitry including
a memory for storing a digitized sinusoidal waveform,
a controller for accessing the waveform, and
a digital-to-analog converter (DAC) for converting the accessed waveform into a sinusoidal oscillatory current control signal;

a current sink coupled to the first terminal and configured to sink therefrom a sinusoidal oscillatory current responsive to the sinusoidal oscillatory current control signal so as to cause the battery to produce at the first terminal a sinusoidal oscillatory voltage equal to or less than the dc operating voltage that would be present at the first terminal in the absence of the sinusoidal oscillatory current, wherein the current sink comprises a transistor including a control terminal having applied thereto a control terminal voltage that varies responsive to the sinusoidal oscillatory current control signal, and a current path coupled between the first and second terminals and configured to sink the sinusoidal oscillatory current from the first terminal responsive to the control terminal voltage.

a resistor connected in series with the transistor current path, the resistor and the transistor current path being connected between the first and second terminals wherein the sinking current produces across the series resistor a sense voltage proportional to a product of a magnitude of the sinusoidal sinking current and a resistance of the series resistor, and an amplifier circuit configured to convert the current control signal to the control terminal voltage in response to the sense voltage; and a voltage sensor configured to sense the oscillatory voltage at the first terminal.

2. The battery monitor of claim 1, wherein the transistor is a Field Effect Transistor (FET), the control terminal is gate of the FET, and the current path coupled between the first and second terminals is a drain-source current path of the FET.

3. The battery monitor of claim 1, wherein the amplifier includes:
a non-inverting input for receiving the current control signal;
an inverting input for receiving the sense voltage; and
an output coupled to the control terminal of the transistor.

4. The battery monitor of claim 1, wherein the voltage sensor includes an analog-to-digital converter (ADC) configured to produce a digitized signal representative of the oscillatory voltage.

5. The battery monitor of claim 4, further comprising:
a wireless transmitter coupled to the voltage sensor and configured to wirelessly transmit a signal indicative of the digitized signal representative of the oscillatory voltage.

6. The battery monitor of claim 4, further comprising a signal conditioner configured to filter and scale an amplitude of the oscillatory voltage to produce a conditioned oscillatory voltage, wherein the ADC converts the conditioned oscillatory voltage to the digitized signal.

7. The battery monitor of claim 1, wherein the oscillatory current includes at least three concurrent sinusoidal frequencies in each of at least three frequency decades.

8. The battery monitor of claim 7, wherein the frequencies include a fundamental frequency and multiple even harmonics thereof.

9. The battery monitor of claim 7, wherein the current sink is configured to sink the oscillatory current for a period of time equal to multiple cycles of a lowest frequency among the at least three frequencies within a given frequency decade.

10. The battery monitor of claim 1, further comprising control circuitry configured to generate an oscillatory current control signal, wherein the current sink is configured to sink the oscillatory current from the first terminal responsive to the oscillatory current control signal.

11. The battery monitor of claim 1, further comprising:
a wireless transmitter coupled to the voltage sensor and configured to wirelessly transmit a signal indicative of the sensed voltage.

12. The battery monitor of claim 1, wherein the current sink is configured to sink the oscillatory current from the first terminal without raising the voltage of the first terminal above its dc operating voltage.

13. The battery monitor of claim 1, further comprising a controller configured to determine an impedance of the battery based on an apriori knowledge of the sinking current and the sensed voltage indicative of the oscillatory voltage.

14. A battery health monitor for monitoring one or more electrical parameters of a battery, the battery including first and second terminals of opposite polarity and configured to produce a direct current (dc) operating voltage at the first terminal, comprising:
control circuitry including
a memory for storing a digitized sinusoidal waveform,
a controller for accessing the waveform, and
a digital-to-analog converter (DAC) for converting the accessed waveform into a sinusoidal oscillatory current control signal;
a current sink coupled to the first terminal and configured to sink therefrom a sinusoidal oscillatory current responsive to the sinusoidal oscillatory current control signal so as to cause the battery to produce at the first terminal a sinusoidal oscillatory voltage equal to or less than the dc operating voltage that would be present at the first terminal in the absence of the sinusoidal oscillatory current; and
a voltage sensor configured to sense the oscillatory voltage at the first terminal,
wherein the sinusoidal oscillatory current includes at least three concurrent sinusoidal frequencies in each of at least three frequency decades, and
wherein all of the frequencies have substantially equal amplitudes.

15. A method of monitoring one or more electrical parameters of a battery having first and second terminals of opposite polarity and configured to produce a direct current (dc) operating voltage at the first terminal, comprising:
accessing a storied digitized sinusoidal waveform;
converting the accessed digitized sinusoidal waveform into a sinusoidal oscillatory current control signal;
sinking, from the first terminal a sinusoidal oscillatory current responsive to the sinusoidal oscillatory current control signal so as to cause the battery produce at the first terminal a oscillatory voltage equal to or less than the dc operating voltage that would be present at the first terminal in the absence of the oscillatory current; and
sensing the oscillatory voltage at the first terminal,
wherein said sinusoidal oscillatory sinking current includes sinking at least three concurrent sinusoidal frequencies in each of at least three decades of frequencies, and
wherein all of the frequencies have substantially equal amplitudes.

16. The method of claim 15, further comprising performing said step of sinking and sensing while a battery operating current flows through the first and second terminals due to either a discharging or a charging of the battery.

17. The method of claim 15, further comprising performing said steps of sinking and sensing while the battery is in an open circuit condition.

18. The method of claim 15, further comprising: determining battery impedance based on apriori knowledge of the sinking current and the sensed oscillatory voltage indicative of the oscillatory voltage.

19. The method of claim 18, wherein said determining step includes: deriving a voltage frequency spectrum of the sensed oscillatory voltage; deriving a current frequency spectrum of the sinking current; and determining, based on the voltage and current frequency spectrums, the battery impedance as a function of frequency.

20. The method of claim 19, wherein said determining step further includes: determining one or more further electrical parameters of the battery based on the battery impedance as a function of frequency.

* * * * *